US007415056B2

(12) United States Patent  
Das et al.

(10) Patent No.: US 7,415,056 B2  
(45) Date of Patent: Aug. 19, 2008

(54) CONFOCAL PULSE STRETCHER

(75) Inventors: Palash P. Das, Vista, CA (US); Thomas Hofmann, San Diego, CA (US); Gang Lei, Elk Grove, CA (US)

(73) Assignee: Cymer, Inc., San Diego, CA (US)

( * ) Notice: Subject to any disclaimer, the term of this patent is extended or adjusted under 35 U.S.C. 154(b) by 83 days.

(21) Appl. No.: 11/394,512

(22) Filed: Mar. 31, 2006

(65) Prior Publication Data

US 2007/0237192 A1 Oct. 11, 2007

(51) Int. Cl.
*H01S 3/22* (2006.01)

(52) U.S. Cl. .......................................... 372/55; 372/57

(58) Field of Classification Search ................ 372/55, 372/57

See application file for complete search history.

(56) References Cited

U.S. PATENT DOCUMENTS

| 6,067,311 | A | 5/2000 | Morton et al. ................ 372/57 |
|---|---|---|---|
| 6,314,119 | B1 | 11/2001 | Morton ......................... 372/57 |
| 6,535,531 | B1 | 3/2003 | Smith et al. ................... 372/25 |
| 6,625,191 | B2 | 9/2003 | Knowles et al. ............... 372/55 |
| 6,693,939 | B2* | 2/2004 | Klene et al. ................... 372/58 |
| 6,928,093 | B2* | 8/2005 | Webb et al. .................... 372/25 |
| 2003/0091087 | A1 | 5/2003 | Ershov et al. ................. 372/55 |
| 2003/0138019 | A1 | 7/2003 | Rylov et al. ................... 372/58 |
| 2004/0182838 | A1 | 9/2004 | Das et al. .................. 219/121.76 |
| 2005/0105579 | A1 | 5/2005 | Smith et al. ................... 372/55 |
| 2005/0141580 | A1 | 6/2005 | Partlo et al. ................... 372/55 |
| 2005/0269300 | A1 | 12/2005 | Partlo et al. ............. 219/121.65 |

OTHER PUBLICATIONS

U.S. Appl. No. 11/261,845, filed Oct. 28, 2005, Akins et al.  
U.S. Appl. No. 11/261,846, filed Oct. 28, 2005, Knowles.  
U.S. Appl. No. 11/261,948, filed Oct. 28, 2005, Das et al.

* cited by examiner

Primary Examiner—Dung T Nguyen  
(74) Attorney, Agent, or Firm—William C. Cray

(57) ABSTRACT

A gas discharge laser system producing a laser output pulse and a method of operating such a system is disclosed which may comprise a pulse stretcher which may comprise a laser output pulse optical delay initiating optic directing a portion of the laser output pulse along a laser system output pulse optical axis and diverting a portion of the output pulse into an optical delay having an optical delay path and which may comprise a plurality of confocal resonators in series aligned to deliver an output of the optical delay to the laser output pulse optical delay initiating optic; an optical axis alignment mechanism comprising an radial mirror positioning mechanism operable to position the output of the optical delay to the align with the portion of the laser output pulse transmitted along the optical axis of the portion of the laser system output pulse transmitted by the laser output pulse optical delay initiating optic.

27 Claims, 8 Drawing Sheets

CONFOCAL PULSE STRETCHER

CROSS-REFERENCE TO RELATED APPLICATIONS

The present application is related to U.S. Pat. No. 6,928,093, issued to Webb, et al. on Aug. 9, 2005, entitled LONG DELAY AND HIGH TIS PULSE STRETCHER, and U.S. Pat. No. 6,693,939, entitled LASER LITHOGRAPHY LIGHT SOURCE WITH BEAM DELIVERY, issued to Klene, et al. on Feb. 17, 2003, and U.S. Pat. No. 6,625,191, entitled VERY NARROW BAND, TWO CHAMBER, HIGH REP RATE GAS DISCHARGE LASER SYSTEM, issued to Knowles, et al. on Sep. 23, 2003, U.S. Pat. No. 6,535,531, entitled GAS DISCHARGE LASER WITH PULSE MULTIPLIER, issued to Smith, et al. on Mar. 18, 2003, U.S. Pat. No. 6,314,119, entitled EXCIMER LASER WITH PULSE AND BEAM MULTIPLIER, issued to Morton on Nov. 6, 2001, U.S. Pat. No. 6,067,311, entitled EXCIMER LASER WITH PULSE MULTIPLIER, issued to Morton, et al. on May 23, 2000; United States Published Patent Application No. 20030138019A1, entitled TWO CHAMBER F2 LASER SYSTEM WITH F2 PRESSURE BASED LINE SELECTION, with inventors Rylov et al. published on Jul. 24, 2003, United States Published Patent Application No. 20030091087A1, entitled LITHOGRAPHY LASER SYSTEM WITH IN-PLACE ALIGNMENT TOOL, with inventors Ershov et al. published on May 15, 2003, and United States Published Patent Application 20050105579, entitled LASER OUTPUT LIGHT PULSE STRETCHER, published on May 19, 2005, with inventors Smith, et al., the disclosures of each of which are hereby incorporated by reference. The present application is also related to U.S. Pending patent applications Ser. No. 11/261,948, entitled SYSTEMS AND METHODS FOR GENERATING A LASER SHAPED AS A LINE BEAM, filed on Oct. 28, 2005, Ser. No. 11/261,846, entitled SYSTEMS AND METHODS TO SHAPE LASER LIGHT AS A LINE BEAM FOR INTERACTION WITH A SUBSTRATE HAVING SURFACE VARIATIONS, filed on Oct. 28, 2005, Ser. No. 11/261,845, entitled SYSTEMS AND METHODS TO SHAPE LASER LIGHT AS A HOMOGENEOUS LINE BEAM FOR INTERACTION WITH A FILM DEPOSITED ON A SUBSTRATE, filed on Oct. 28, 2005, Ser. No. 11/201,877, entitled LASER THIN FILM POLY-SILICON ANNEALING OPTICAL SYSTEM, filed on Aug. 8, 2005, Ser. No. 10/884,547, entitled LASER THIN FILM POLY-SILICON ANNEALING SYSTEM, filed on Jul. 1, 2004, Ser. No. 10/781,251, entitled VERY HIGH ENERGY, HIGH STABILITY GAS DISCHARGE LASER SURFACE TREATMENT SYSTEM, filed on Feb. 18, 2004, all relate to thin beam laser annealing surface treatment systems that are useful with aspects of embodiments f the present invention, the disclosures of which are hereby incorporated by reference.

FIELD OF THE INVENTION

The present invention relates to pulse stretchers useful for lengthening the pulse of the output of a high power gas discharge laser system in order to reduce peak power of the pulse while delivering essentially the same dose, e.g., for uses as a pulsed light source, e.g., in integrated circuit manufacture photolithography.

BACKGROUND OF THE INVENTION

Pulse stretchers are well known as indicated by the above referenced patents and co-pending patent applications. While devices implemented according to aspects of the concept of the inventions disclosed in United States Published Patent Application No. 20050105579 noted above may be quite useful for the applications noted above and others, in particular the con-focal pulse stretcher has certain shortcomings for such uses that need improvement.

Applicants according to aspects of embodiments of the present invention propose such improvements.

SUMMARY OF THE INVENTION

A gas discharge laser system producing a laser output pulse and a method of operating such a system is disclosed which may comprise a pulse stretcher which may comprise a laser output pulse optical delay initiating optic directing a portion of the laser output pulse along a laser system output pulse optical axis and diverting a portion of the output pulse into an optical delay having an optical delay path and which may comprise a plurality of confocal resonators in series aligned to deliver an output of the optical delay to the laser output pulse optical delay initiating optic; an optical axis alignment mechanism comprising an radial mirror positioning mechanism operable to position the output of the optical delay to the align with the portion of the laser output pulse transmitted along the optical axis of the portion of the laser system output pulse transmitted by the laser output pulse optical delay initiating optic. The plurality of confocal resonators may comprise an even number of confocal resonators comprising a multiple of the even number of confocal resonator number of passes through such even number of mirror arrangement, e.g., four confocal resonators comprising a twelve pass mirror arrangement. Each of the plurality of confocal resonators may comprise a first concave mirror having a radius of curvature and a second concave mirror having the same radius of curvature and separated by the radius of curvature. At least one of the concave mirrors may comprise a spherical concave mirror. The positioning mechanism may comprise a means for adjusting the position of the respective mirror in a radial direction away from the center of the sphere forming to focus of the spherical shape of the confocal mirror. The gas discharge laser system producing a laser output pulse may comprise a pulse stretcher which may comprise a laser output pulse optical delay initiating optic transmitting a portion of the laser output pulse along a laser system output pulse optical axis and diverting a portion of the output pulse into an optical delay having an optical delay path and which may comprise a plurality of confocal resonators in series aligned to deliver an output of the optical delay to the laser output pulse optical delay initiating optic; an optical axis altering mechanism comprising an optically transmissive optical element operable to position the output of the optical delay to align with the portion of the laser output pulse transmitted along the optical axis of the portion of the laser system output pulse transmitted by the laser output pulse optical delay initiating optic. The transmissive optical element may comprise a generally flat optical element. The optically transmissive element comprises a wedge optical element.

Figure 6:
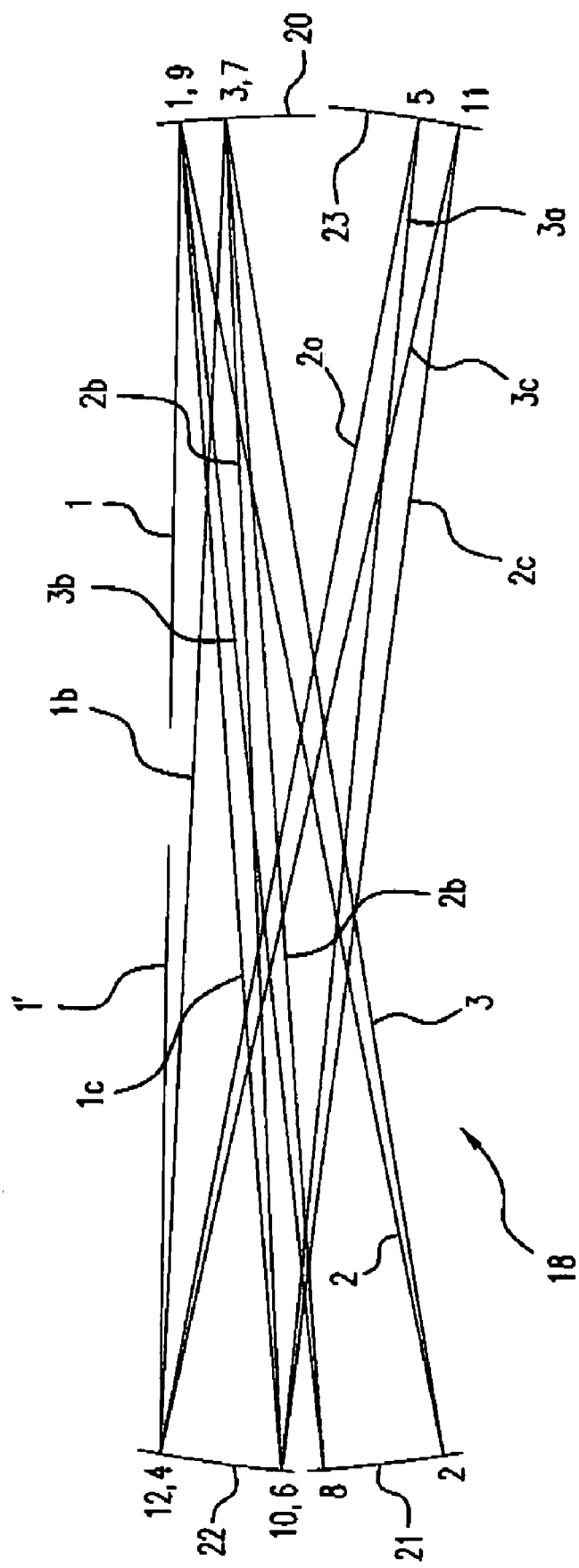

FIG's. 3-5 show aspects of the operation according to an embodiment of the present invention showing, e.g., the tilt tolerance aspect of an embodiment of the present invention;

FIG. 6 illustrates partially schematically in cross section, e.g., the tilt tolerance of the pulse stretcher according to FIG's. 1-2.

Figure 7:
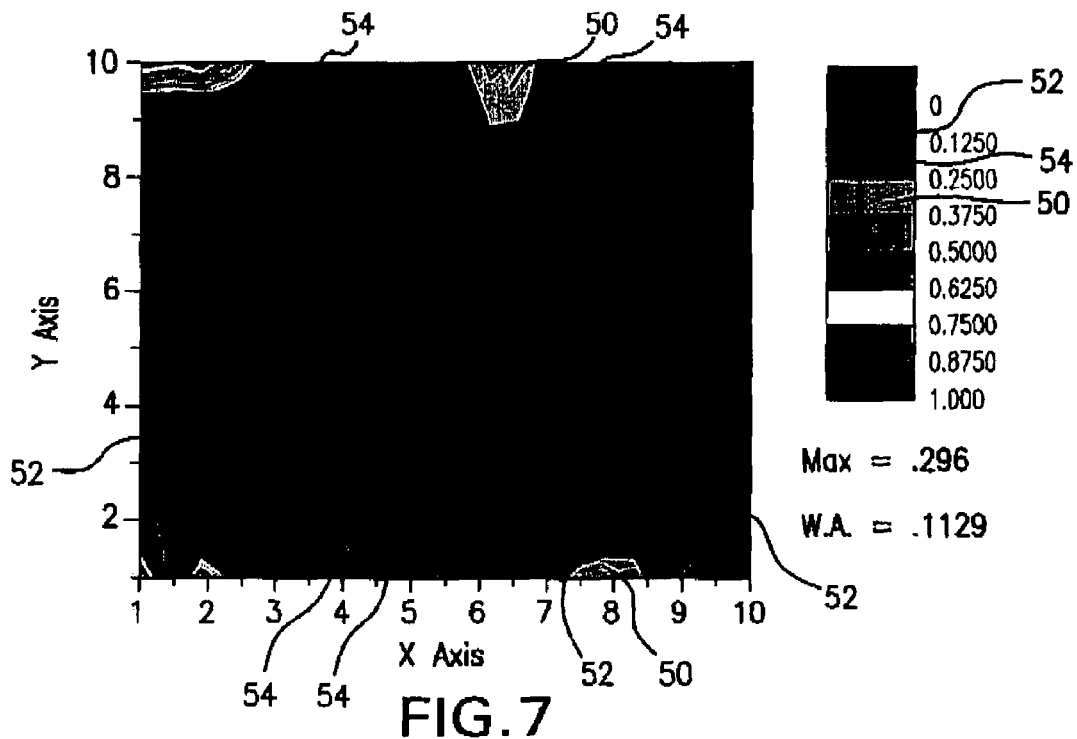
Figure 8:
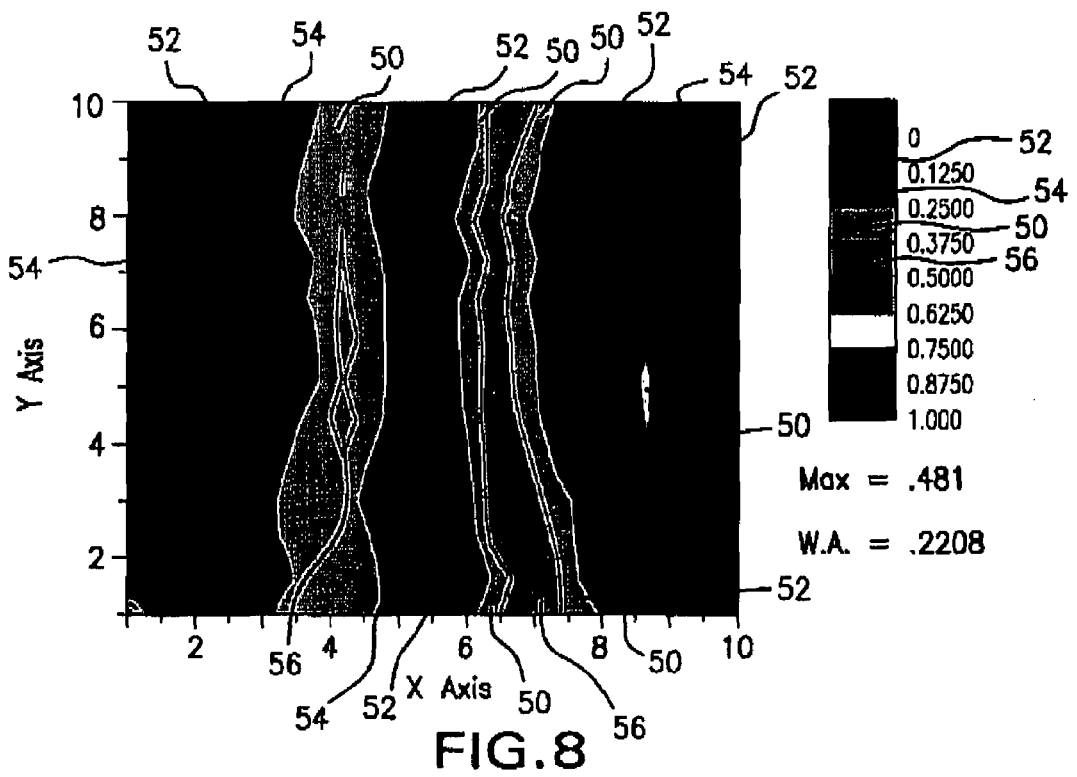
Figure 9:
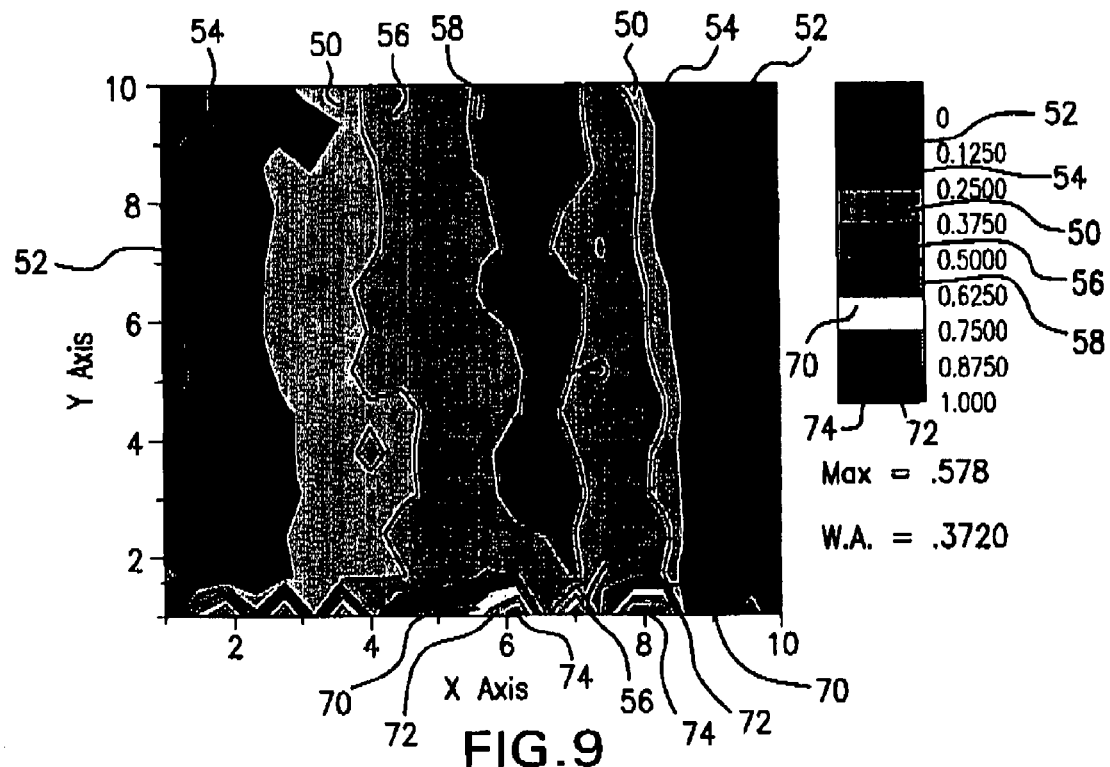
Figure 10:
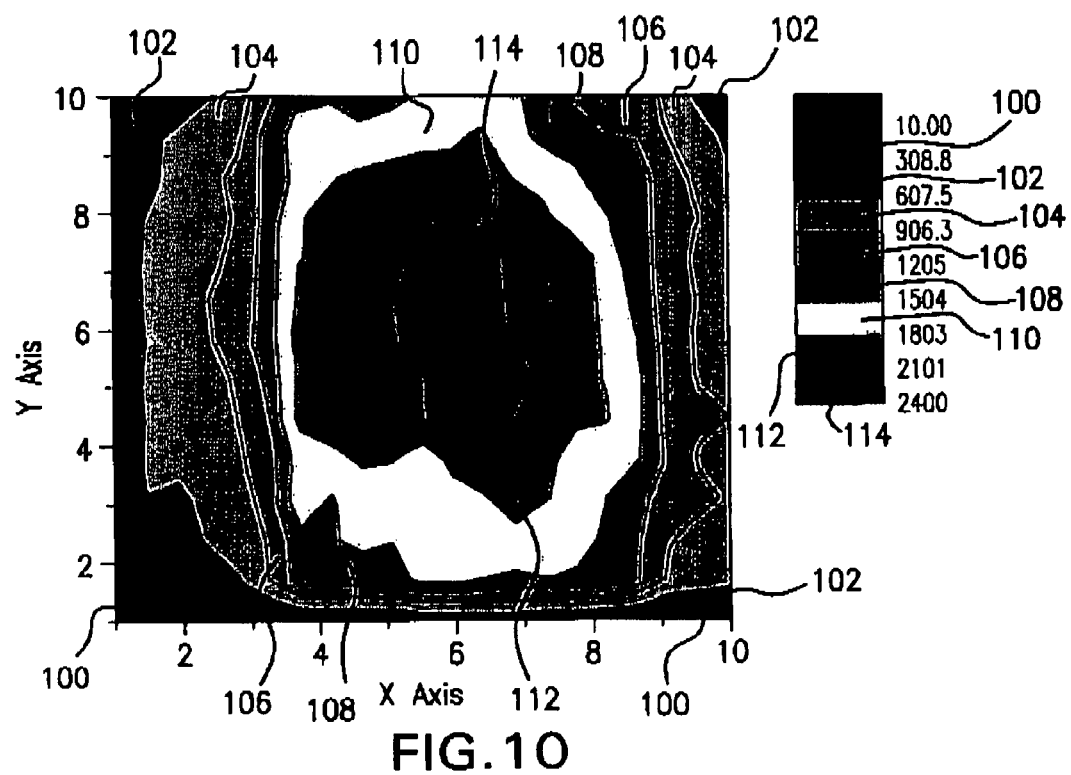

FIG. 7 shows a measurement of the two dimensional spatial coherence of an output laser pulse passed through two pulse stretchers in series according to aspects of an embodiment of the present invention;

FIG. 8 shows a measurement of the two dimensional spatial coherence of an output laser pulse passed through a single pulse stretcher according to aspects of an embodiment of the present invention;

FIG. 9 shows a measurement of the two dimensional spatial coherence of an output laser pulse without any pulse stretching according to an aspect of an embodiment of the present invention; and FIG. 10 shows a two dimensional measurement of the intensity distribution of an output laser pulse according to an aspect of an embodiment of the present invention.

Figure 11:
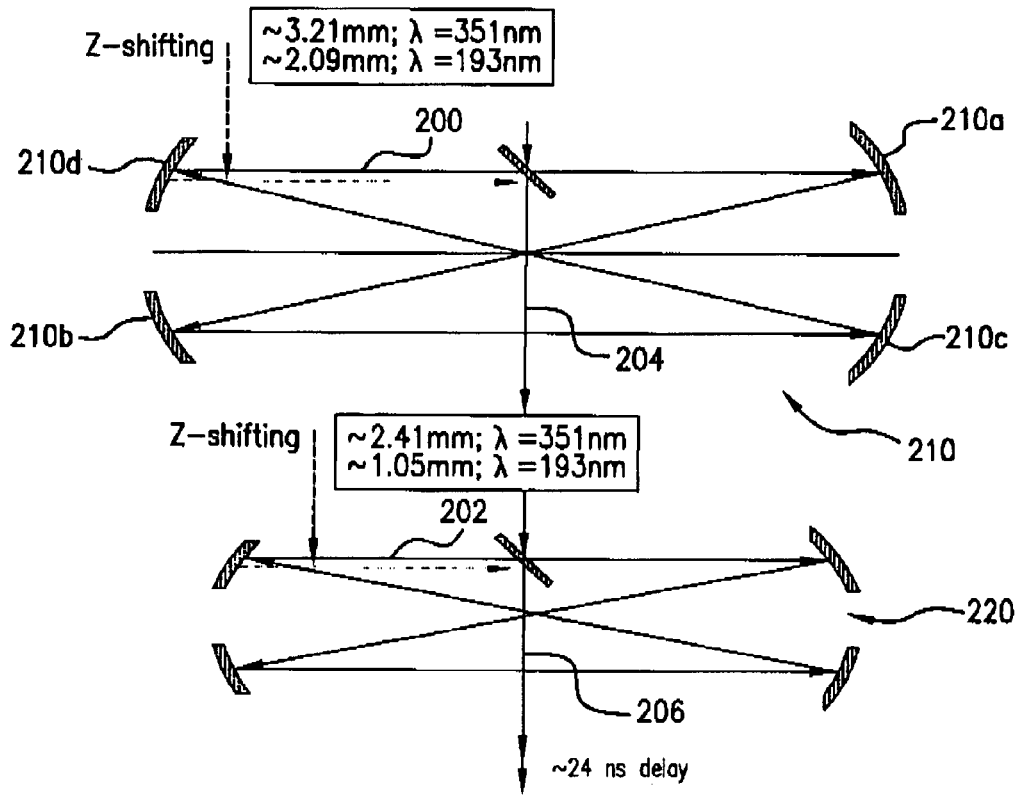
Figure 12:
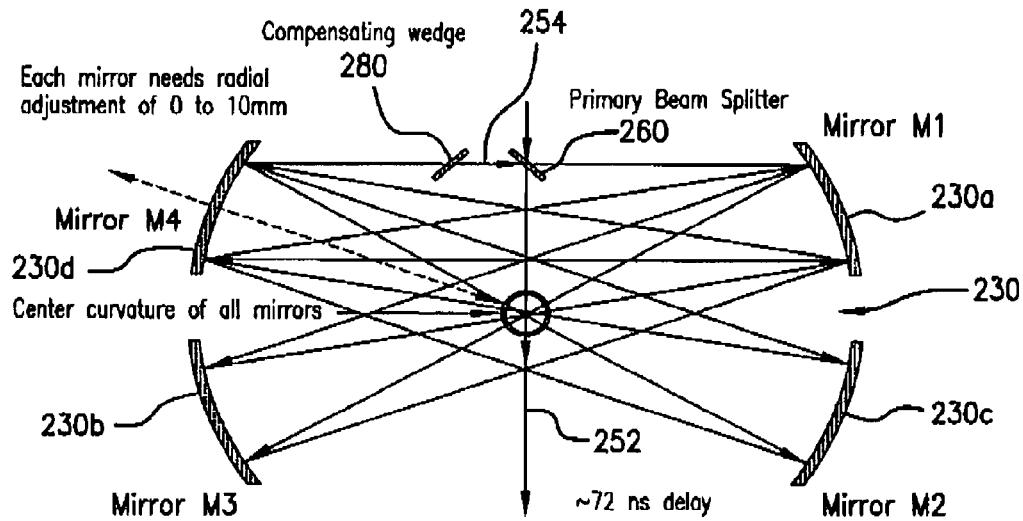
Figure 13:
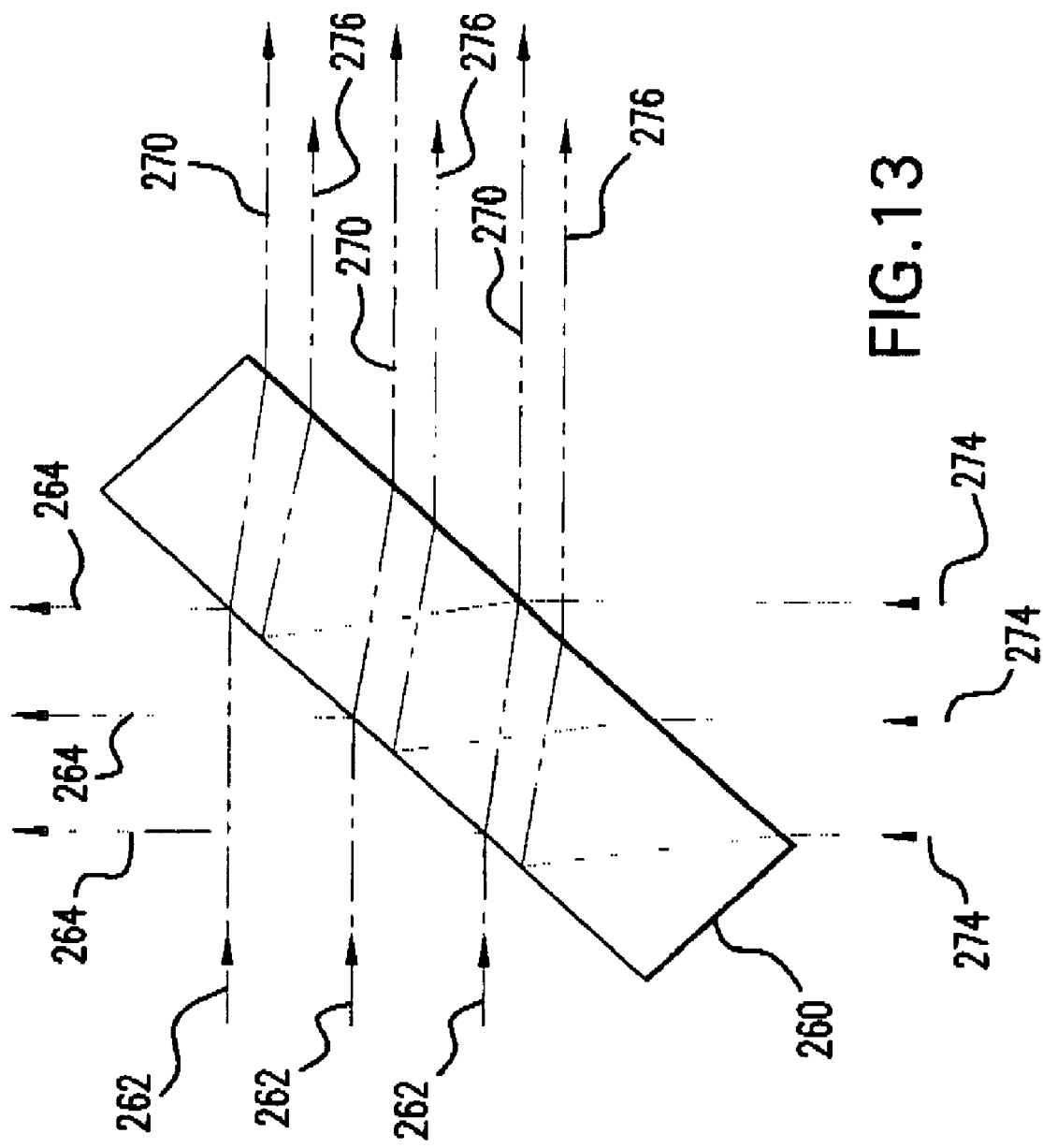
Figure 14:
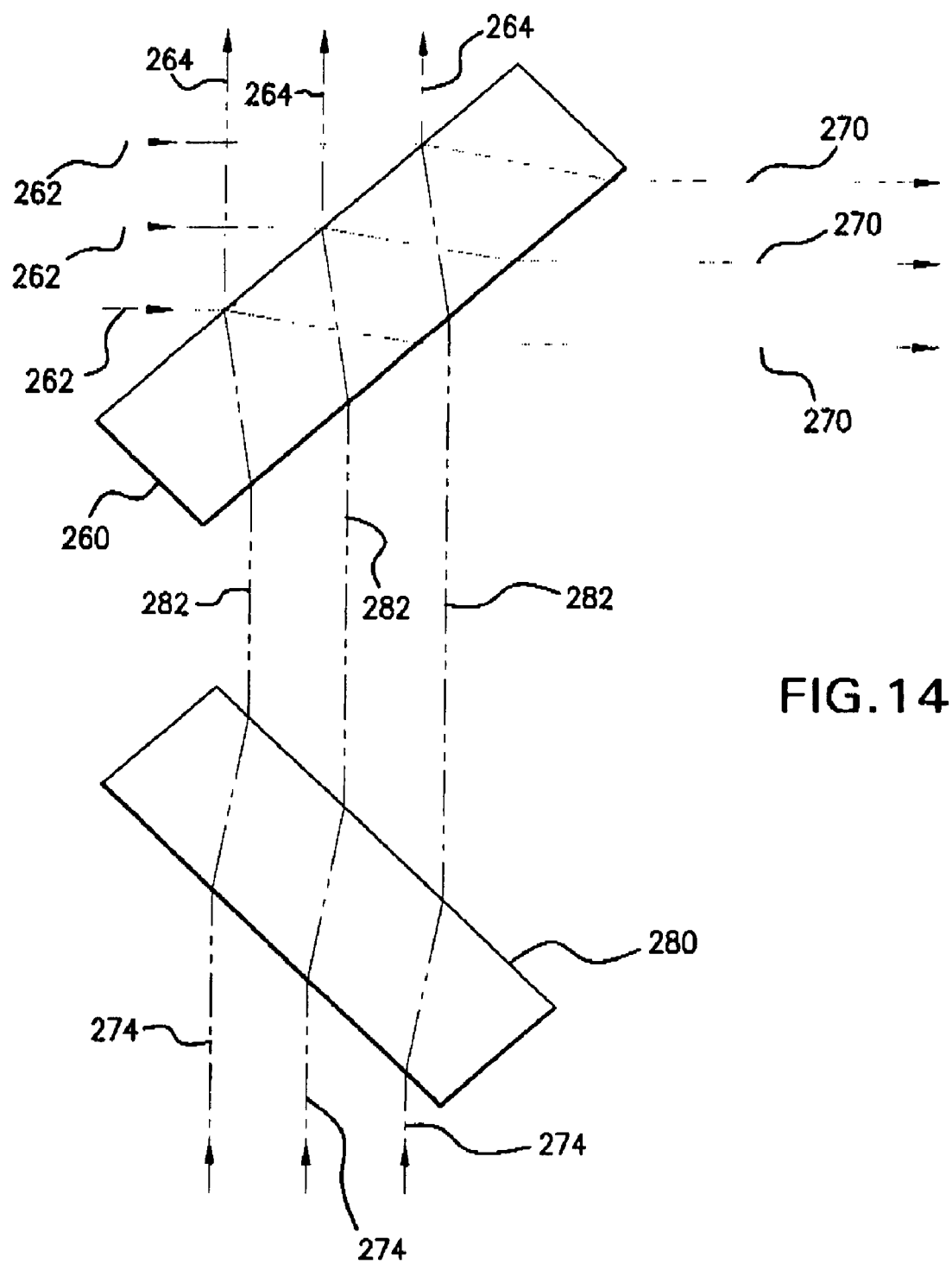

FIG. 11 shows schematically an example of an alignment technique useful with non-confocal pulse stretchers described in the present application and one or more of the above referenced patents and/or patent applications;

FIG. 12 shows schematically aspects of an embodiment of the present invention;

FIG. 13 shows schematically aspects of a problem with prior confocal lens pulse stretchers corrected according to aspects of an embodiment of the present invention;

FIG. 14 shows schematically aspects of an embodiment of the present inventions.

DETAILED DESCRIPTION OF PREFERRED EMBODIMENTS

According to aspects of an embodiment of the present invention applicant has designed an optical pulse stretcher for a laser light source, e.g., a gas discharge laser light source, e.g., a KrF or ArF or molecular fluorine gas discharge laser, e.g., for use in integrated circuitry lithography illumination, which has a long optical delay, but is constrained to have a practical physical length, e.g., less than about 8 feet, e.g., in order to be mounted on existing laser frames or contained within a beam delivery unit and fit, e.g., in a fabrication facility clean room sub-floor room. According to aspects of an embodiment of the present invention, the pulse stretcher may be, e.g., a multi-passing system with a minimum number of optics, e.g., four, consistent with proper operation. This, in addition, e.g., minimizes the number of adjustments necessary to align a system, and according to aspects of an embodiment of the present invention the system is designed to allow for a considerable amount of misalignment over systems of the prior art. According to an aspect of an embodiment of the present invention the pulse stretcher comprises, e.g., a unique optical design that produces 12 passes with only 4 mirrors. Such a pulse stretcher is capable of, e.g., an optical pulse stretching having, e.g., an 80 ns delay from a physical length of about 2 meters and a total of 4 mirrors. According to aspects of an embodiment of the present invention also, the pulse stretcher disclosed, e.g., does not suffer the focusing problems of, e.g., a Herriott Cell nor the re-entry and symmetry problems of, e.g., a White Cell.

What is so remarkable about aspects of an embodiment of the present invention, in addition to its space efficiency is its stability. The design is so stable that it may require no adjustments for alignment. According to aspects of an embodiment of the present invention stability can be derived, e.g., from the fact that the design is essentially 4 confocal resonators, having, e.g., the re-entry characteristic of a confocal resonator. According, e.g., the beam will retrace its path no matter what the angle orientation exists between the two mirrors forming, e.g., the respective confocal resonator, as long as the beam intercepts the respective next mirror in the respective confocal resonator. This concept can be most easily identified by examining one section of the layout as shown in FIG.'S 3-6. Turning first to FIG.'S 1 and 2, however, there is shown a pulse stretcher 18 according to aspects of an embodiment of the present invention.

The pulse stretcher [11] may comprise, e.g., four focusing mirrors, e.g., concave spherical mirrors 20, 21, 22, 23, which may be, e.g., 10 cm in diameter, e.g., for handling adequately a beam size or e.g., 1.2 cm×1.2 cm. Each of the mirrors 20, 21, 22 and 23 is separated by a radius of curvature of the spherical mirror preceding it in a respective confocal resonator cell and may have, e.g., a radius of curvature of e.g., about 1.6–2 meters. In operation, e.g., the beam 1 can enter the delay path formed by the mirrors 20, 21, 22, 23 through a beam splitter (not shown in FIG.'S 1 and 2 for clarity reasons) and be incident at a first point 1 on the mirror 20. From point 1 on the mirror the reflected beam 2 is incident on point 2 on mirror 21, and from there, the reflected beam 3 returns to mirror 20 at point three. From point 3 on mirror 20, the reflected beam 1a is incident on point 4 on mirror 22 and from there the reflected beam 2a is incident on point 5 on mirror 23 and the reflected beam from point 5 on mirror 23 is returned to mirror 22 as reflected beam 3a incident on point 6 on mirror 22.

A third confocal resonator cell is then set up as the beam reflected from point 6 on mirror 22, beam 1b reflected to point 7 on mirror 20 and from there is reflected as beam 2b incident on point 8 on mirror 21 and then returned to mirror 20 at point 9 on mirror 20 as beam 3b. The reflected beam from point 9 on mirror 20, beam, 1c is incident on point 10 on mirror 22 and reflected from there as beam 2c to point 11 on mirror 23 and from there, reflected beam 3c is incident on point 12 on mirror 22 which is aligned to return reflected beam 1' to the beam splitter (not shown in FIG.'S 1 and 2).

Turning now to FIGS. 3-6 it can be seen that no matter what the angle orientation of the mirrors 20, 21, 22, 23 in a respective confocal resonance cell, the beam will always come back to the same point 12 on mirror 22. FIG.'S 3-6 illustrates the effect within a single confocal resonance cell of misalignment from perfect alignment, e.g., as illustrated in FIG.'S 1-2. Because of, e.g., this property, the 12 pass design 18 will always be aligned as long as the mirrors, e.g., mirrors 20, 21, 22, 23 are positioned well enough to redirect the beam from a first mirror in a respective confocal resonator cell to the correct opposing mirror. Therefore, the angular allowance of the system is driven be the size of the mirrors and the size of the beam. This also means, e.g., that the design is almost completely immune to, e.g., initial misalignment or, e.g., vibration problems that cause relative movements between the mirrors, e.g., mirrors 20, 21, 22 and 23, provided that the variations are small enough as to not to redirect the beam off the respective opposing mirror.

Figure 1:
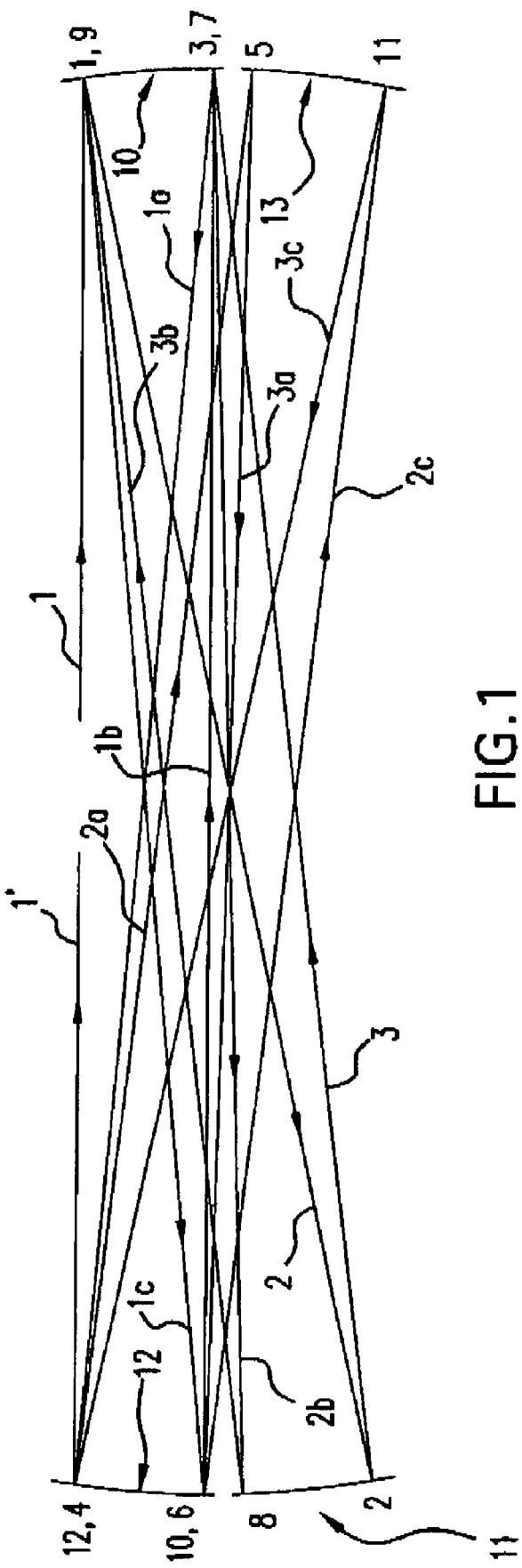
FIG. 1 shows a partially schematic cross-sectional view of a pulse stretcher according to aspects of an embodiment of the present invention.
Figure 2:
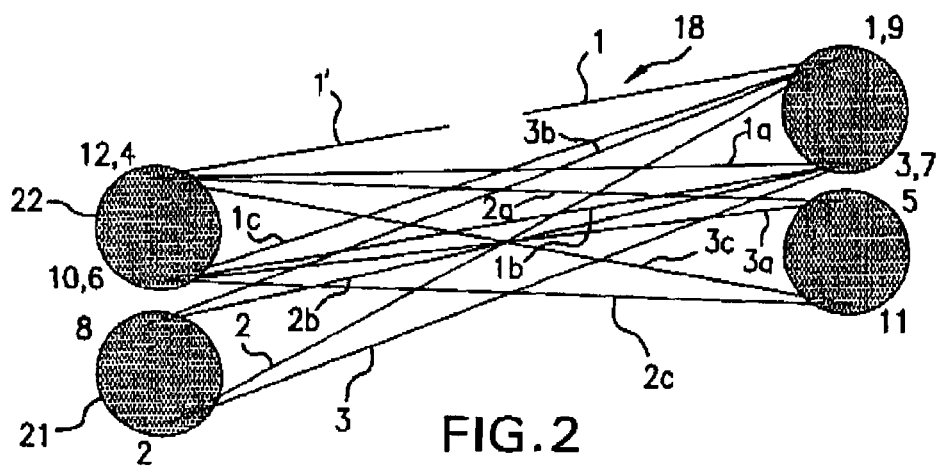
FIG. 2 shows a partially schematic perspective view of the pulse stretcher according to FIG. 1.
Figure 3:
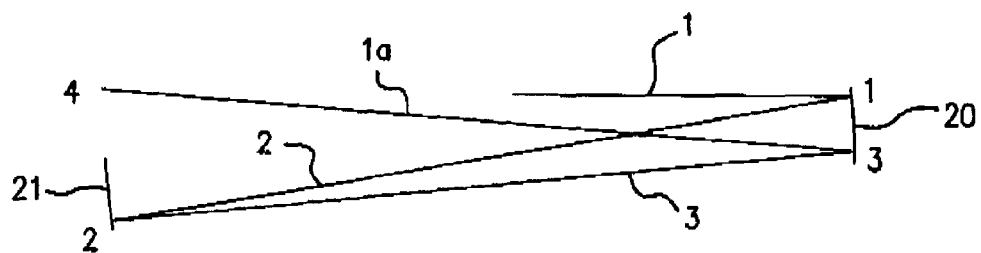

Turning now to FIG. 3 there is shown, e.g., a first of the confocal resonance cells according to FIG.'S 1 and 2, showing, e.g., beams 1, 2 and 3 in a first confocal resonance cell as shown, e.g, in FIG.'S 1 and 2, e.g., with the mirrors 20 and 21 aligned so that, e.g., the full extent of mirror 20 is used to separate points 1 and 3 and showing the reflection from point 2 on mirror 21 returning to point 3 on mirror 2o, from which it is reflected to point 4 on mirror 22 (not shown in FIG.'S 3-5).

Figure 4:
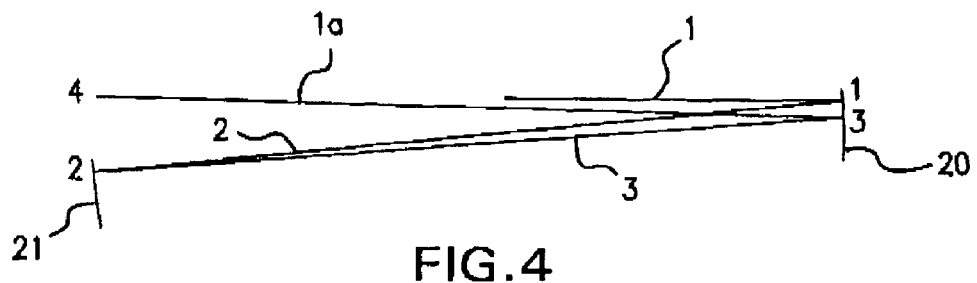
Figure 5:
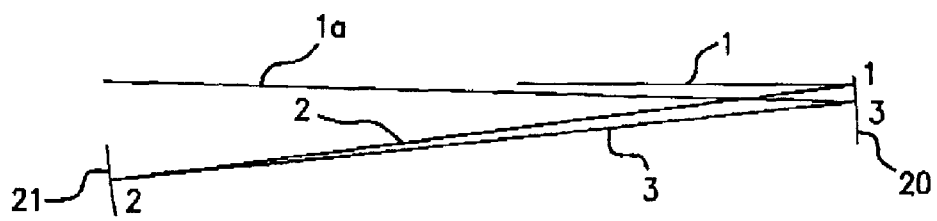

Turning to FIG. 4 three is shown according to an aspect of an embodiment of the present invention the effect of, e.g., a small misalignment of mirror 20, e.g., a 1.5° tilt, such that, e.g., the point 2 on mirror 21 to which beam 2 travels from point 1 on mirror 20, due to the misalignment is displaces almost completely across the face of the mirror 21, but remaining on the face of the mirror 21. As can be seen, the respective beam 3, incident on point 3 of mirror 20 is also reflected to a point 3 that is displaced across the face of the mirror 20 from that shown e.g., in FIG.'S 1-3, but as can also be seen, the beam 1a reflecting from point 3 on mirror 20 to point 4 on mirror 22 remains incident on a point 4 on mirror 22 that is essentially the same as illustrated in FIG.'S 1-3, despite the misalignment of mirror 20.

Turning to FIG. 5, three is illustrated schematically, e.g., the effect of a misalignment of mirror 21 according to aspects of an embodiment of the present invention wherein the beam 2 is incident on mirror 21 at a point 2 displaces across the face of mirror 21, also displacing the point 3 on mirror, similarly to FIG. 4, but with the beam 1a reflected from point 3 on mirror 20 in FIG. 5 again returning to the proper point 4 on mirror 22 (not shown in FIG. 5.)

FIG.'S 4 and 5 illustrate, e.g., that despite misalignment of mirror 20 with respect to mirror 21, which can include misalignment of both from the perfect alignment, illustrated schematically in FIG.'S 1-3, the beam reflects back upon itself and so long as it remains within the confines of the surface of the mirror 20 (the first mirror of the respective confocal resonator) the exit beam from the respective confocal resonator will arrive at the proper place on the next mirror in sequence, e.g., mirror 22 (not shown in FIG.'S 4 and 5).

Turning now to FIG. 6 there is shown schematically the operation of the entire pulse stretcher according to an aspect of an embodiment of the present invention with, e.g., a slight tilt in a mirror 20, 21, 22 or 23, e.g., mirror 21. FIG. 6 shows that despite the misalignment the last beam 1' remains perfectly aligned with the beam splitter (not shown) output of the delay path for the pulse stretcher 18 according to aspects of an embodiment of the present invention.

In operation a single pulse stretcher of the type described according to aspects of an embodiment of the present invention may stretch a typical excimer or other fluorine gas discharge laser, e.g., a molecular fluorine gas discharge laser, having a pulse duration of the output laser pulse of on the order of about 40 ns having, e.g., a $T_{IS}$ of on the order of about, e.g., 8 ns, to a pulse having several peaks not greater than, e.g., about 40% of the input peak power to the pulse stretcher 18 according to aspects of an embodiment of the present invention, and having, e.g., a $T_{IS}$ of on the order of about 45 ns.

It will also be understood, that increasing the radius of curvature of the mirrors 20, 21, 22 and 23 can increase by the achievable pulse stretching and $T_{IS}$, at the expense of some increase in overall length of the pulse stretcher 18 according to aspects of an embodiment of the present invention and also larger mirror size and, therefore, a larger housing footprint transversely of the overall pulse stretcher length. According to another aspect of an embodiment of the present invention, a method of scanning the laser beam and calculating weighted average of the spatial coherence is proposed, e.g., for measuring more accurately the spatial coherence of an output laser beam pulse as is pertinent to proper performance of the output laser beam pulse in properly serving the function of, e.g., an integrated circuit lithography tool light source, e.g., a DUV light source. Implementation of this method revealed interesting aspects of laser output light pulse beam profiles, e.g., in regard to spatial coherence, e.g., for XLA beam spatial coherence profiles. Applicants have discovered that an aspect of using, e.g., a beam stretcher according to aspects of an embodiment of the present invention can provide very beneficial output laser pulse beam spatial coherency properties. It is most desirable to limit spatial coherency.

Utilizing, e.g., two pairs of pin holes, and an X-Y automated scanning setup (not shown) along with imaging optics (not shown) and a photo-diode array ("PDA"), and along with computer control to, e.g., acquire and analyze the data, applicants have reviewed the spatial coherency in two dimensions of a beam that has not been passed through a pulse stretcher, a so-called Optical Pulse Stretcher ("OpuS") provided along with certain of applicants' assignee's products, e.g., XLA series products. This scanning means of estimation of output laser pulse coherence produced data illustrated, e.g., in FIG.'S 7-9, showing respectively the information regarding two dimensional beam coherency for, respectively an unstretched pulse, i.e., a pulse not passed through applicants' assignee's OpuS (FIG. 7), a pulse passed through a single stage pulse stretcher, e.g., applicants' assignee's OpuS, and an output laser pulse beam passed through a two stage Opus. Applicants' assignee's OpuS in addition to stretching the pulses to improve, e.g., $T_{IS}$, performs certain, e.g., optical flipping and rotating and the like, of the output laser pulse beam, with results indicated illustratively in FIG.'S 7-9.

TABLE I

|  | XLA no OPuS | XLA one 2x OpuS (XLA100) | XLA two OpuS 4x OPuS (XLA105 |
|---|---|---|---|
| Peak contrast | 0.58 | 0.48 | 0.30 |
| Weighted Average | 0.37 | 0.22 | 0.11 |

As shown in FIG. 7, and listed in Table I, the output laser pulse has a peak contrast of about, e.g., 0.3, and a weighted average overall of about, e.g., 0.11. FIG. 7 shows that the horizontal and vertical coherency is low, with, e.g., most of the beam being in regions 52 (0-0.125) as indicated in the bar graph to the right of the illustration or region 54 ((0.125-0.250), with some small portions of the beam in region 50 (0.250-0.375), and some further still smaller portions in other ranges, which are due to boundary effects of the measurement setup. These measurements were taken with a 2× OpuS pulse stretcher and a 4× Opus pulse stretcher in place in the beam path.

Turning to FIG. 8 there is shown an illustration of the beam becoming more coherent, particularly as measured in the x-axis, including much more of the beam in range 50 (0.250-0.375) and also including still further areas in range 56 (0.375-0.500). These measurements were taken with only a 2× OpuS in place in the beam path.

As shown in FIG. 9, the beam is even more coherent when both pulse stretchers are out of the beam path, now including a more definite distribution of more or less equal areas in the ranges 50-54 and distributed more or less symmetrically about the vertical centerline axis of the beam along the x-axis and further now including a significant portion in range 58 (0.500-0.625) with some small portions of the beam in the ranges 70 (0.625-0.750), 72 (0.750-0.875) and 74 (0.875-1.000). Coherency is being measured through the diffraction fringes set up by the beam passing through the pin holes across the beam profile, with the more coherent light in the laser beam resulting in more fringes and more contrast.

For the beam of FIG. 8, as indicated in Table I, the maximum contract increased to 0.48 and the overall weighted average increased to 0.22 and for FIG. 9, the maximum contract increased to 0.58 and the overall weighted average to 0.37. This amounts to, e.g., an almost one half increase in the maximum contrast and an almost two thirds decrease in overall weighted average.

As can be seen from the above, the pulse stretcher has not only the beneficial results of increasing pulse length and decreasing peak pulse intensity, resulting in higher $T_{IS}$ but also is a very efficient reducer of spatial coherence in the output laser light beam.

Turning now to FIG. 10, there is shown a beam intensity profile in two dimensions, including, e.g., intensities ranging from 10-308.8 arbitrary units of scale, in region 100, generally around the periphery of the beam profile to 2101-2400 arbitrary units of scale (region 114) generally at the center of the beam profile, with regions 102 (308.8-607.5), 104 (607.5-906.3), 106 (906.3-1205), 108 (1205-1504), 108 (1504-

1803), 112 (1803-2101) and 114 (2101-2400) generally from the periphery to the center of the beam profile.

Turning now to FIG. 11 there is shown schematically an alignment technique useful with pulse stretchers referred to in one or more of the above referenced U.S. patents and pending applications. In trying to actually implement the confocal 200 ns OPUS, e.g., as disclosed in United States Published Patent Application No. 20050105579 noted above, applicants discovered that such a design had certain shortcomings. These pertain, e.g., for applications such as integrated circuit photolithography or for high energy surface treatment, e.g., for LTPS applications as noted in certain above referenced patent applications.

A confocal pulse stretcher, such as noted above, can be an excellent instrumentality for stretching pulses. The confocal design can be utilized to provide a very stable beam which is very insensitive to input beam pointing variations. However, the technique of so-called z shifting of the last OPUS mirror used in other forms of 2× or 4× pulse stretchers, such as those sold in or with applicant's assignee,'s laser systems, e.g., ELS 7XXX or XLA 1XX, 2XX or 3XX has been found not to work in the confocal design. As shown, e.g., in FIG. 11 z shifting can be utilized to ensure the delayed beam 200 in, e.g., a first pulse stretcher 210 and 202 in a second pulse stretcher 220, neither of which is a confocal pulse stretcher, can be made to overlap the respective non-delayed beam 204, 206. Without such an overlap then the quality of the combination beam formed by the variously delayed beams will be detracted, e.g., the image of the beams may be, e.g., out of focus.

Turning to FIG. 12, there is shown schematically such a confocal pulse stretcher 230 as disclosed, e.g., in the United States Published Patent Application No. 20050105579 noted above, with certain improvements. Since the mirrors 230a-d of a confocal pulse stretcher 230 may not be independently adjustable, z shifting would not work. In addition, such a confocal design is very sensitive to the radius of curvature of the mirrors, e.g., 230a-d. Therefore, a standard, e.g., ±2% mirror radius of curvature tolerance could lead to a non-manufacturable design.

According to aspects of embodiments of the present invention the proposed changes to the earlier described confocal pulse stretcher can result in a confocal pulse stretcher (OPuS) useful for both photolithography and for producing a long pulse that is well suited for crystal growth in excimer laser crystallization. As shown in FIG.'S 1.2-14 according to aspects of an embodiment of the present invention applicants propose to provide a compensating plate 280 as shown in FIG. 12, and in more detail in FIG. 14. Such an arrangement can be utilized to solve the problem of overlapping the output beam 252 with the beam 254 exiting the pulse stretcher, such that the delayed beam 254 essentially ally overlaps the main beam 252, e.g., in both position and angle.

According to aspects of an embodiment of the present invention, applicants also propose, as illustrated schematically in FIG. 12, to provide for at least one mirror 230a-d to be adjustable in position in a radial direction, e.g., to solve the problem of the confocal pulse stretcher being un-aligned due, e.g., to incorrect radius of curvature for the mirrors, though still within achievable manufacturing tolerance. This is shown in FIG. 12. Applicants have found that it is sufficient to adjust one mirror axially to compensate for variation in radius of curvature of all mirrors. More than one mirror may be so adjusted also by radial adjustment or otherwise.

Turning now to FIG. 13, there is shown a beam splitter that introduces the laser output light beam 262 into the delay path, e.g., by reflecting part of the beam 262 as beam 264. The remainder of the beam passes through the beam splitter 260 and forms output beam 270 with a slight refraction in the beam splitter 260. The beam 274 returning from the delay path to the beam splitter 260 may be aligned with the beam 264 leaving the beam splitter 260 and entering the delay path but the internal reflection in the beam splitter will misalign the beams 270 and 276 as illustrated schematically in FIG. 13.

FIG. 14 shows schematically the effect of introducing a compensating wedge 280. As illustrated, the compensating wedge can translate the output beam 282 from the compensating wedge 280 which enters the compensating wedge as beam 274 aligned with the beam 264 entering the delay path, sufficiently to align the internally reflected beam 282 with the main output beam 270 from the pulse stretcher. It will be understood that this beam 270 may also enter into a subsequent pulse stretcher.

It will be understood by those skilled in the art that a gas discharge laser system producing a laser output pulse and a method of operating such a system is disclosed which may comprise a pulse stretcher which may comprise a laser output pulse optical delay initiating optic directing a portion of the laser output pulse along a laser system output pulse optical axis and diverting a portion of the output pulse into an optical delay having an optical delay path and which may comprise a plurality of confocal resonators in series aligned to deliver an output of the optical delay to the laser output pulse optical delay initiating optic; an optical axis alignment mechanism comprising an radial mirror positioning mechanism operable to position the output of the optical delay to the align with the portion of the laser output pulse transmitted along the optical axis of the portion of the laser system output pulse transmitted by the laser output pulse optical delay initiating optic. For example the respective confocal mirror may comprise a mounting that holds the mirror in its aligned position, e.g., with the radius of curvature. The mounting plate may be mounted in a frame by at least one adjustable mounting mechanism, e.g., aligned with the radius of curvature of the confocal mirror. the adjustable mounting mechanism may comprise, e.g., a threaded attachment, e.g., with threads having a pitch, e.g., in the mm range, and which, when the threaded attachment is rotated, serves to move the mounting plate with respect to the adjustable mounting mechanism, thus selectively positioning the respective confocal mirror along its radius of curvature. The plurality of confocal resonators may comprise an even number of confocal resonators comprising a multiple of the even number of confocal resonator number of passes through such even number of mirror arrangement, e.g., four confocal resonators comprising a twelve pass mirror arrangement. Each of the plurality of confocal resonators may comprise a first concave mirror having a radius of curvature and a second concave mirror having the same radius of curvature and separated by the radius of curvature. At least one of the concave mirrors may comprise a spherical concave mirror. The positioning mechanism may comprise a means for adjusting the position of the respective mirror in a radial direction away from the center of the sphere forming to focus of the spherical shape of the confocal mirror. The gas discharge laser system producing a laser output pulse may comprise a pulse stretcher which may comprise a laser output pulse optical delay initiating optic transmitting a portion of the laser output pulse along a laser system output pulse optical axis and diverting a portion of the output pulse into an optical delay having an optical delay path and which may comprise a plurality of confocal resonators in series aligned to deliver an output of the optical delay to the laser output pulse optical delay initiating optic; an optical axis altering mechanism comprising an optically transmissive optical element operable to position the output of the optical delay to align with the portion of the laser output pulse transmitted along the optical axis of the portion of the laser system output pulse transmitted by the laser output pulse optical delay initiating optic. The transmissive optical element may comprise a generally flat optical element. The optically transmissive element comprises a wedge optical element.

It will be understood by those skilled in the art that many changes and modifications may be made to the present invention and aspects of the present invention without departing from the scope and content of the appended claims and that the appended claims should not be limited in scope or content to the particular aspects of preferred embodiments disclosed in the present application.

We claim:

1. A gas discharge laser system producing a laser output pulse comprising:
   a pulse stretcher comprising:
   a laser output pulse optical delay initiating optic directing a portion of the laser output pulse along a laser system output pulse optical axis and diverting a portion of the output pulse into an optical delay having an optical delay path and comprising:
   a plurality of confocal resonators in series aligned to deliver an output of the optical delay to the laser output pulse optical delay initiating optic,
   wherein at least one of the plurality of confocal resonators is configured to be radially adjustable so as to position the output of the optical delay to align with the portion of the laser output pulse transmitted along the optical axis of the portion of the laser system output pulse transmitted by the laser output pulse optical delay initiating optic.

2. The apparatus of claim 1 further comprising:
   the plurality of confocal resonators comprises an even number of confocal resonators and the number of passes through the even number of confocal resonators comprising a multiple of the even number of confocal resonators.

3. The apparatus of claim 1 further comprising:
   four confocal resonators comprising a twelve pass mirror arrangement.

4. The apparatus of claim 2 further comprising:
   four confocal resonators comprising a twelve pass mirror arrangement.

5. The apparatus of claim 1 further comprising:
   each of the plurality of confocal resonators comprises a first concave mirror having a radius of curvature and a second concave mirror having the same radius of curvature and separated by the radius of curvature.

6. The apparatus of claim 2 further comprising:
   each of the plurality of confocal resonators comprises a first concave mirror having a radius of curvature and a second concave mirror having the same radius of curvature and separated by the radius of curvature.

7. The apparatus of claim 3 further comprising:
   each of the plurality of confocal resonators comprises a first concave mirror having a radius of curvature and a second concave mirror having the same radius of curvature and separated by the radius of curvature.

8. The apparatus of claim 4 further comprising:
   each of the plurality of confocal resonators comprises a first concave mirror having a radius of curvature and a second concave mirror having the same radius of curvature and separated by the radius of curvature.

9. The apparatus of claim 5 further comprising:
   at least one of the concave mirrors comprises a spherical concave mirror.

10. The apparatus of claim 6 further comprising:
    at least one of the concave mirrors comprises a spherical concave mirror.

11. The apparatus of claim 7 further comprising:
    at least one of the concave mirrors comprises a spherical concave mirror.

12. The apparatus of claim 8 further comprising:
    at least one of the concave mirrors comprises a spherical concave mirror.

13. A gas discharge laser system producing a laser output pulse comprising:
    a pulse stretcher comprising:
    a laser output pulse optical delay initiating optic transmitting a portion of the laser output pulse along a laser system output pulse optical axis and diverting a portion of the output pulse into an optical delay having an optical delay path and comprising:
    a plurality of confocal resonators in series aligned to deliver an output of the optical delay to the laser output pulse optical delay initiating optic;
    an optical axis altering mechanism comprising an optically transmissive optical element operable to position the output of the optical delay to align with the portion of the laser output pulse transmitted along the optical axis of the portion of the laser system output pulse transmitted by the laser output pulse optical delay initiating optic.

14. The apparatus of claim 13 further comprising:
    the plurality of confocal resonators comprises an even number of confocal resonators and the number of passes through the even number of confocal resonators comprising a multiple of the even number of confocal resonators.

15. The apparatus of claim 14 further comprising:
    four confocal resonators comprising a twelve pass mirror arrangement.

16. The apparatus of claim 13 further comprising:
    each of the plurality of confocal resonators comprises a first concave mirror having a radius of curvature and a second concave mirror having the same radius of curvature and separated by the radius of curvature.

17. The apparatus of claim 14 further comprising:
    each of the plurality of confocal resonators comprises a first concave mirror having a radius of curvature and a second concave mirror having the same radius of curvature and separated by the radius of curvature.

18. The apparatus of claim 15 further comprising:
    each of the plurality of confocal resonators comprises a first concave mirror having a radius of curvature and a second concave mirror having the same radius of curvature and separated by the radius of curvature.

19. The apparatus of claim 16 further comprising:
    at least one of the concave mirrors comprises a spherical concave mirror.

20. The apparatus of claim 17 further comprising:
    at least one of the concave mirrors comprises a spherical concave mirror.

21. The apparatus of claim 18 further comprising:
    at least one of the concave mirrors comprises a spherical concave mirror.

22. The apparatus of claim 19 further comprising:
    the transmissive optical element comprises a generally flat optical element.

23. The apparatus of claim 20 further comprising:
the transmissive optical element comprises a generally flat optical element.

24. The apparatus of claim 21 further comprising:
the transmissive optical element comprises a generally flat optical element.

25. The apparatus of claim 19 further comprising:
the optically transmissive element comprises a wedge optical element.

26. The apparatus of claim 20 further comprising:
the optically transmissive element comprises a wedge optical element.

27. The apparatus of claim 21 further comprising:
the optically transmissive element comprises a wedge optical element.

* * * * *